United States Patent
Lee et al.

(10) Patent No.: US 8,411,520 B2
(45) Date of Patent: Apr. 2, 2013

(54) SEMICONDUCTOR MEMORY DEVICE AND METHOD OF REDUCING CONSUMPTION OF STANDBY CURRENT THEREIN

(75) Inventors: Myung-Jae Lee, Bucheon-si (KR); Sang Seok Kang, Suwon-si (KR); Jong Hyoung Lim, Hwasung-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 520 days.

(21) Appl. No.: 12/654,739

(22) Filed: Dec. 30, 2009

(65) Prior Publication Data

US 2010/0172193 A1 Jul. 8, 2010

(30) Foreign Application Priority Data

Jan. 5, 2009 (KR) .................. 10-2009-0000384

(51) Int. Cl.
*G11C 7/00* (2006.01)
*G11C 29/00* (2006.01)

(52) U.S. Cl. .................. 365/201; 365/185.18; 365/185.2

(58) Field of Classification Search ............. 365/185.18, 365/185.2, 185.09, 200, 201; 324/762.01, 324/762.03

See application file for complete search history.

(56) References Cited

U.S. PATENT DOCUMENTS

| | | | | |
|---|---|---|---|---|
| 6,781,902 B2 * | 8/2004 | Oumiya et al. | ............... | 365/201 |
| 7,315,481 B2 * | 1/2008 | Ito | ............... | 365/210.1 |
| 7,382,668 B2 * | 6/2008 | Park et al. | ............... | 365/201 |
| 7,499,310 B2 * | 3/2009 | Park et al. | ............... | 365/154 |
| 7,515,502 B1 * | 4/2009 | Ahsan et al. | ............... | 365/230.03 |
| 2009/0040849 A1 * | 2/2009 | Mori et al. | ............... | 365/201 |

FOREIGN PATENT DOCUMENTS

| | | | |
|---|---|---|---|
| JP | 08-306197 A | | 11/1996 |
| KR | 1998-066731 A | | 10/1998 |
| KR | 2005072529 A | * | 7/2005 |
| KR | 10-2006-0082978 A | | 7/2006 |

* cited by examiner

*Primary Examiner* — Tuan T Nguyen
*Assistant Examiner* — Lance Reidlinger
(74) *Attorney, Agent, or Firm* — Lee & Morse, P.C.

(57) ABSTRACT

A semiconductor memory device comprises a memory array including a plurality of bit lines and a plurality of dummy bit lines, a bias application unit configured to supply bias voltages having a plurality of voltage levels to the plurality of dummy bit lines, a standby current measuring unit configured to measure a value of at least one of standby currents between at least one of the plurality of bit lines and at least one of the plurality of dummy bit lines. Each of the standby currents is generated by each of the bias voltages applied by the bias application unit.

16 Claims, 7 Drawing Sheets

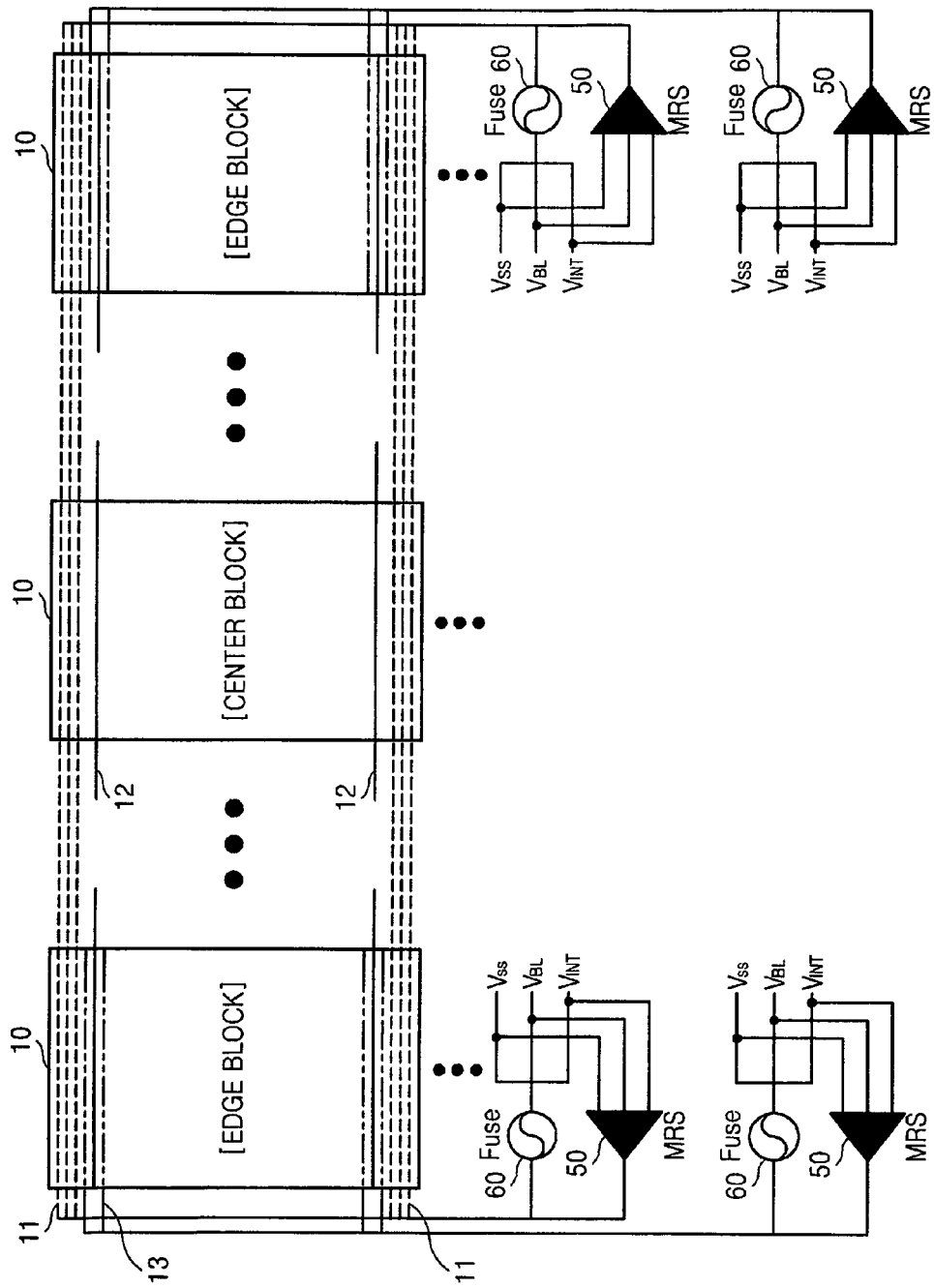

SEMICONDUCTOR MEMORY DEVICE AND METHOD OF REDUCING CONSUMPTION OF STANDBY CURRENT THEREIN

BACKGROUND

1. Field

Embodiments relate to a semiconductor device and a controlling method thereof, and more particularly, to a semiconductor memory device in which consumption of a standby current due to an electric current path of a normal cell may be reduced by applying a voltage capable of reducing the standby current to a dummy bit line included in a memory array, and a method of reducing consumption of a standby current therein.

2. Description of the Related Art

In a semiconductor memory device, a memory array may include a dummy cell and a dummy bit line and a dummy word line connected to the dummy cell. A bit line or a word line formed in the edge portion of the memory array may not be able to maintain reliability during a semiconductor manufacturing process. Therefore, the bit or word line in the edge portion may be designated as the dummy bit line or the dummy word line. The dummy bit line or the dummy word line may be excluded from a normal operation of the semiconductor memory device.

When a normal cell is replaced with a redundant cell because of its defect, an unwanted standby current may be consumed at the current path since the original current path still exists.

More specifically, when a defective cell exists between a normal cell and a dummy cell, and thus, generate electric short-circuit, and the defective cell may be replaced with a redundancy cell. However, the current path still remains between the dummy cell and the defective cell. A standby current flowing the current path between the dummy cell and the defective cell may considerably deteriorate reliability of the semiconductor memory device.

SUMMARY

It is therefore a feature of an embodiment to provide a semiconductor memory device, comprising: a memory array including a plurality of bit lines and a plurality of dummy bit lines; a bias application unit configured to supply bias voltages having a plurality of voltage levels to the plurality of dummy bit lines; and a standby current measuring unit configured to measure a value of at least one of standby currents between at least one of the plurality of bit lines and at least one of the plurality of dummy bit lines, each of the standby currents being generated by each of the bias voltages applied by the bias application unit.

The semiconductor memory device may further comprises a control unit configured to control the bias application unit so as to supply a bias voltage having any one of the plurality of voltage levels to each of the plurality of dummy bit lines, based on a measured value of a standby current generated by the bias voltage having any one of the plurality of voltage levels.

The control unit may controls the bias application unit so as to supply a first bias voltage among the bias voltages having the plurality of voltage levels to each of the plurality of dummy bit lines, the first bias voltage generating the minimum standby current.

The bias application unit may apply a bias voltage to each of the plurality of dummy bit lines in a unit of a chip, banks, or blocks included in the semiconductor memory device.

The plurality of voltage levels may comprise a ground voltage level, a power voltage level, and a plurality of voltage levels between the ground voltage level and the power voltage level.

Differences between consecutive voltage levels of the plurality of voltage levels are the same.

It is therefore another feature of an embodiment to provide a semiconductor memory device comprising: a mode register set (MRS) in which a plurality of operation modes corresponding to a plurality of voltage levels are set and stored; a fuse configured to allow a bias voltage to be supplied to each of a plurality dummy bit lines, to the bias voltage having one of the voltage levels set in any one of the plurality of operation modes stored in the MRS; and a controller configure to measure a value of at least one of standby currents between the plurality of dummy bit lines and a plurality of bit lines, each of the standby currents generated by each of voltage supplied by the fuse, and to control the fuse to allow a voltage generating a minimum standby current to be supplied to each of the plurality of dummy bit lines.

The fuse allows the voltage generating the minimum standby current to be supplied to each of the plurality of dummy bit lines in a unit of a chip, banks, or blocks included in the semiconductor memory device.

It is therefore another feature of an embodiment to provide a method of reducing a standby current in a semiconductor memory device that comprises a memory array including a plurality of bit lines and a plurality of dummy bit lines, comprising: supplying bias voltages having a plurality of voltage levels to the plurality of dummy bit lines; measuring a value of at least one of standby currents between at least one of the plurality of bit lines and at least one of the plurality of dummy bit lines, each of the standby currents being generated by each of the bias voltages; and supplying a bias voltage having any one of the plurality of voltage levels to each of the plurality of dummy bit lines, based on a measured value of a standby current generated by the bias voltage having any one of the plurality of voltage levels.

It is therefore another feature of an embodiment to provide a method of reducing a standby current in a semiconductor memory device that comprises a memory array including a plurality of bit lines and a plurality of dummy bit lines, comprising: setting and storing a plurality of operation modes corresponding to a plurality of voltage levels in a MRS; allowing a bias voltage to be supplied to each of a plurality dummy bit lines with a fuse, the bias voltage having one of the voltage levels set in any one of the plurality of operation modes stored in the MRS; and measuring a value of at least one of standby currents between the plurality of dummy bit lines and a plurality of bit lines, each of the standby currents generated by each of voltage supplied by the fuse; and controlling the fuse to allow a voltage generating a minimum standby current to be supplied to each of the plurality of dummy bit lines.

The inventive concept provides a semiconductor memory device which may reduce a standby current that may be generated between a bit line and a dummy bit line so that performance and reliability of a memory device may be increased.

BRIEF DESCRIPTION OF THE DRAWINGS

The above and other features and advantages will become more apparent to those of ordinary skill in the art by describing in detail exemplary embodiments with reference to the attached drawings, in which:

FIG. 2 illustrates a schematic diagram of a circuit configured to a bias voltage to a dummy bit line in a semiconductor memory device according to an exemplary embodiment;

DETAILED DESCRIPTION

Figure 1:
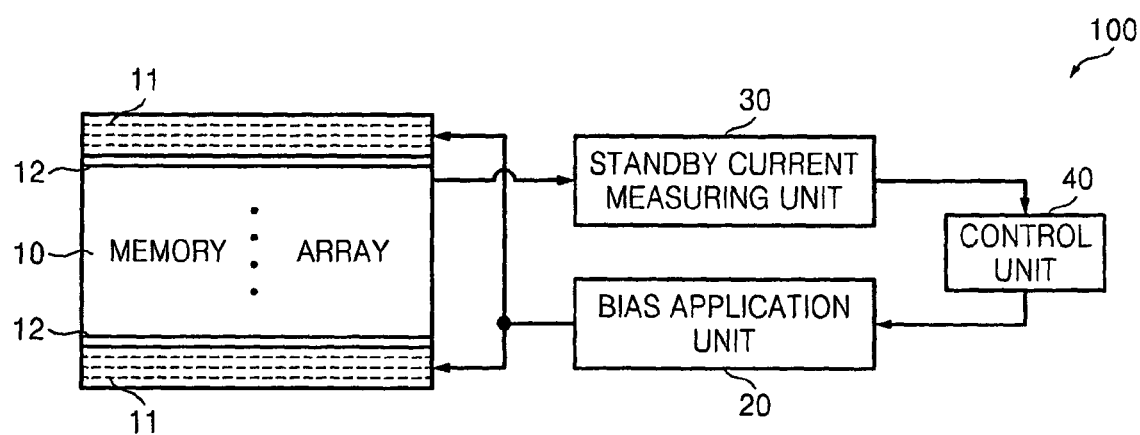
FIG. 1 illustrates a schematic block diagram of a semiconductor memory device according to an exemplary embodiment.

Korean Patent Application No. 10-2009-0000384, filed on Jan. 5, 2009, in the Korean Intellectual Property Office, and entitled: "Semiconductor Memory Device," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

FIG. 1 is a schematic block diagram of a semiconductor memory device 100 according to an exemplary embodiment. Referring to FIG. 1, the semiconductor memory device 100 may include a memory array 10, a bias application unit 20, and a standby current measuring unit 30.

The memory array 10 may include a plurality of bit lines 12 and a plurality of dummy bit lines 11. The bit lines 12, which may be normal, may be used as a path to supply a predetermined voltage to a cell during a data read/write operation. The dummy bit lines 11 may not actually be used for the data read/write operation, and may be implemented as, for example, a plurality of redundant bit lines.

When the memory array 10 is implemented in a unit of blocks, each of the outermost blocks included in the memory array 10 may further include at least one edge bit line. The edge bit line may be implemented as a redundant bit line.

The bias application unit 20 may apply a bias voltage having any one of a plurality of voltage levels to each of the dummy bit lines 11. The number, values, and intervals of bias voltages having the voltage levels may vary according to an exemplary embodiment. For example, referring to FIG. 2, the voltage levels may include a ground voltage level $V_{SS}$, a power voltage level $V_{INT}$, and a plurality of voltage levels existing between the ground voltage level $V_{SS}$ and the power voltage level $V_{INT}$. Also, differences between consecutive voltage levels may be the same or different over the voltage levels.

According to an exemplary embodiment, the bias application unit 20 may include a voltage generator (not shown) configured to generate bias voltages having the voltage levels, or may obtain bias voltages generated from another circuit and supply the obtained bias voltages to the dummy bit lines 11.

The standby current measuring unit 30 may measure a standby current generated between the bit lines 12, which may be normal, and the dummy bit lines 11 by changing the bias voltage output from the bias application unit 20.

Also, the semiconductor memory device 100 may further include a control unit 40 configured to control the bias application unit 20 so as to constantly supply a bias voltage having any one of the voltage levels to each of the dummy bit lines 11, based on a value of a standby current measured by the standby current measuring unit 30. For example, the control unit 40 may control the bias application unit 20 so as to apply to each of the dummy bit lines 11 a bias voltage that generates the minimum standby current among the bias voltages having the voltage levels.

The memory array 10 of FIG. 1 may be implemented in a unit of a chip, banks, or blocks. Thus, the bias application unit 20 may apply a bias voltage to a unit of a chip, blocks, or banks.

FIG. 2 is a schematic diagram of a circuit configured to apply a bias voltage to the dummy bit lines 11 in a semiconductor memory device according to an exemplary embodiment. Referring to FIGS. 1 and 2, the memory array 10 may include a plurality of blocks. Each block may include the dummy bit lines 11 and the bit lines 12, which may be normal. Edge blocks located at the outermost sides of the memory array 10 may further include at least one edge bit line 13. Also, according to an exemplary embodiment, a MRS 50 and a fuse 60 may be used to apply a bias voltage to the dummy bit lines 11.

In general, a mode register may be used as storage for setting and storing an operation mode. The MRS 50 may include a set of the mode registers. The MRS 50 may be controlled by a controller (not shown). The MRS 50 may store information corresponding to a plurality of voltage modes. Each of the voltage modes allow a bias voltage having any one of the voltage levels to be applied to the dummy bit lines 11.

When any one of the voltage modes is selected from the MRS 50, via the fuse 60, a bias voltage corresponding to the voltage mode selected from the MRS 50 may be applied to each of the dummy bit line 11 or the edge bit line 13. Although one of the three voltage levels $V_{SS}$, $V_{BL}$, and $V_{INT}$ as illustrated in FIG. 2 is applied to the dummy bit line 11 or the edge bit line 13, the embodiment is not limited to this.

The controller may control the fuse 60 so as to apply only a bias voltage that minimizes the standby current to the dummy bit line 11 or the edge bit line 13. For example, the fuse 60 may block paths for supplying bias voltages except for a bias voltage that generates the minimum standby current. Thus, as the bias voltage that generates the minimum standby current is applied to each of the dummy bit lines 11, performance or efficiency of the semiconductor memory device may not be degraded.

Figure 3A:
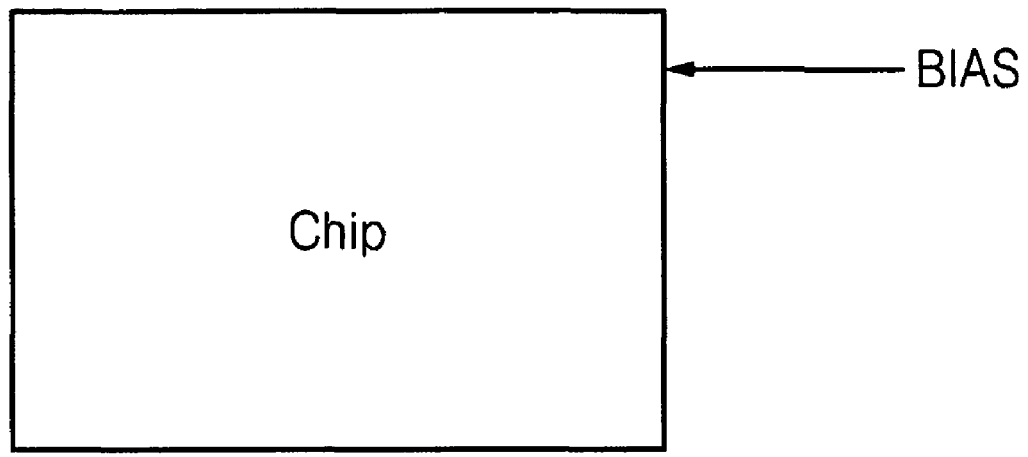
FIGS. 3A-3C illustrate schematic block diagrams for explaining a method of applying a bias voltage to a unit of a chip, banks, or blocks according to an exemplary embodiment.
Figure 3B:
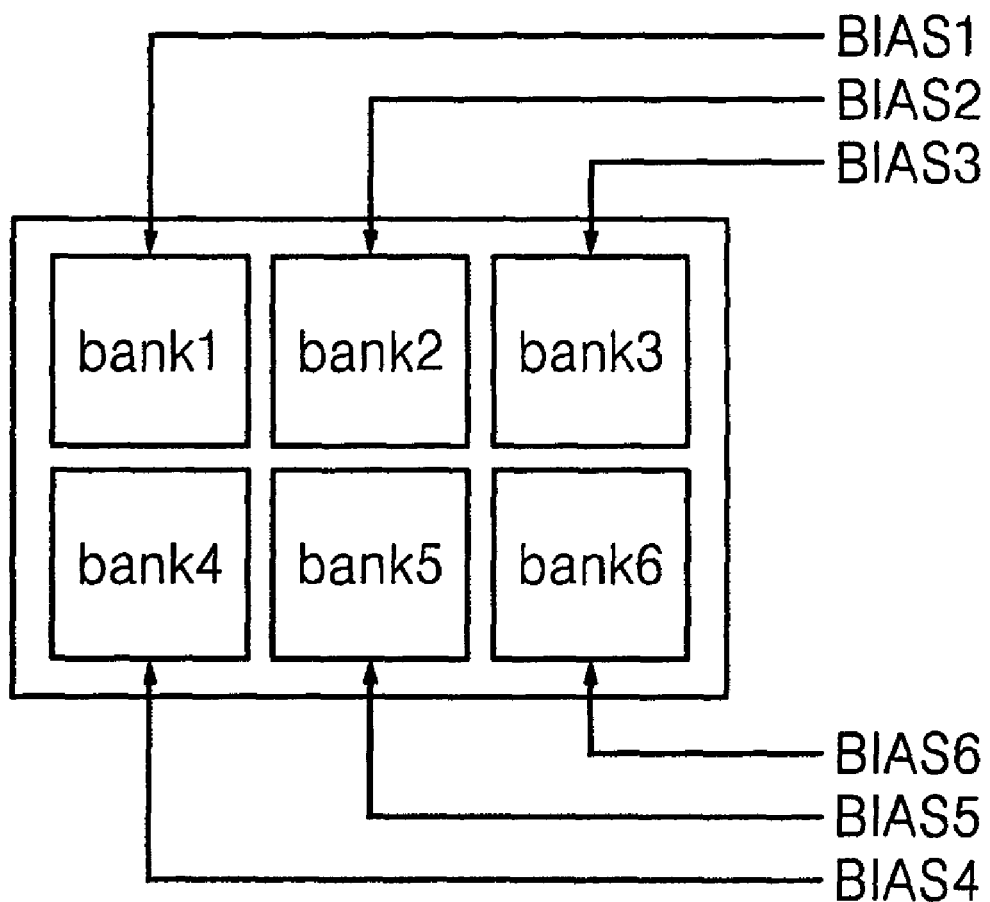
Figure 3C:
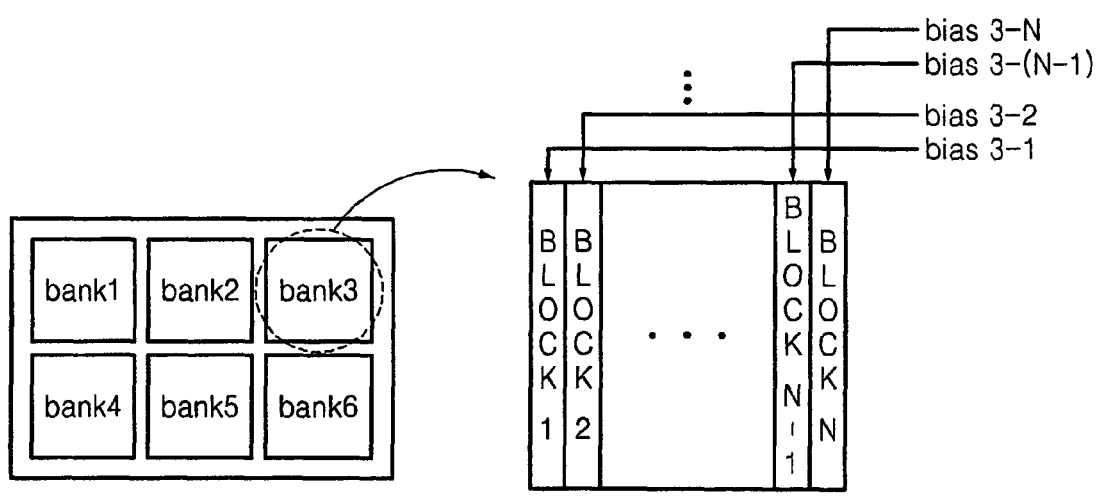

FIGS. 3A-3C are schematic block diagrams for explaining a method of applying a bias voltage in a unit of a chip, banks, or blocks, according to an exemplary embodiment. As described above, the method of applying a bias voltage according to an exemplary embodiment may be performed in a unit of a chip, banks, or blocks.

FIG. 3A illustrates that a bias voltage BIAS is applied to a unit of a chip. FIG. 3B illustrates that bias voltages BIAS1-BIAS6 are applied to a unit of banks. FIG. 3C illustrates that bias voltages bias 3-1-bias 3-N are applied to a unit of blocks. Although in the exemplary embodiment the unit to which the bias voltage(s) is applied is a chip, banks, or blocks, the embodiments may employ other memory units.

Figure 4:
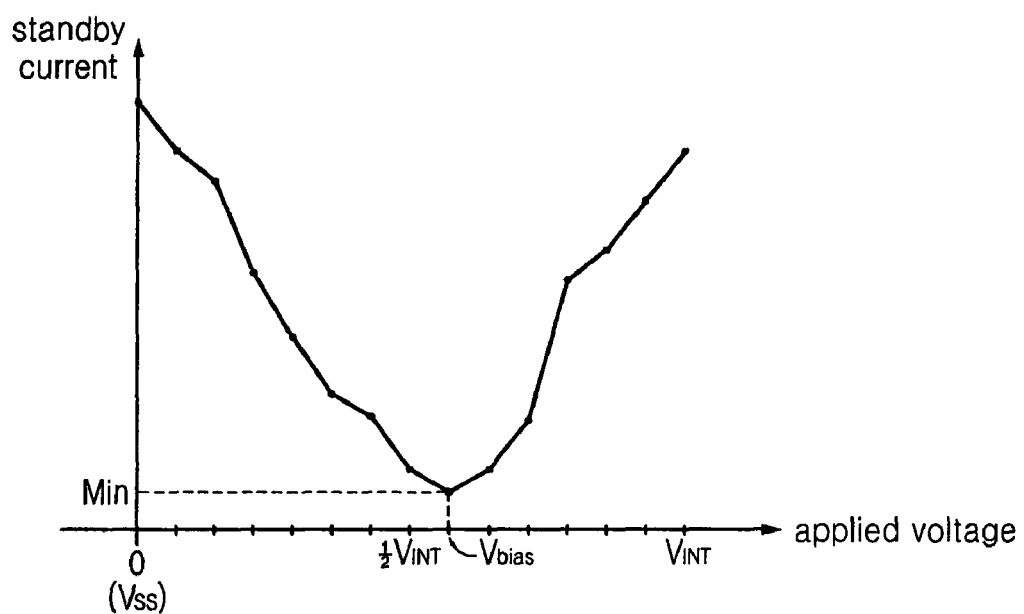
FIG. 4 illustrates a graph presenting the relationship between a standby current generated a bias voltage applied to the dummy bit line.

FIG. 4 is a graph of the relationship between a standby current generated and a bias voltage applied to the dummy bit line. Referring to FIGS. 1-4, the bias application unit 20 may apply bias voltages having a plurality of voltage levels. For example, as illustrated in FIG. 4, bias voltages having fifteen voltage levels are applied to the dummy bit line(s) 11 or the edge bit line(s) 13. The standby current measuring unit 30 may measure the standby current generated by each of the bias voltages applied by the bias application unit 20.

Although FIG. 4 illustrates that the interval of the consecutively applied bias voltages is constant, the interval of consecutively applied bias voltages may vary. As shown in FIG. 4, Vbias is a bias voltage generating the minimum standby current. The bias voltage Vbias may be obtained by measuring a standby current corresponding to each of the voltage levels. The semiconductor memory device may be implemented such that the obtained bias voltage Vbias may be applied to the dummy bit line(s) 11 or the edge bit line(s) 13.

Figure 5:
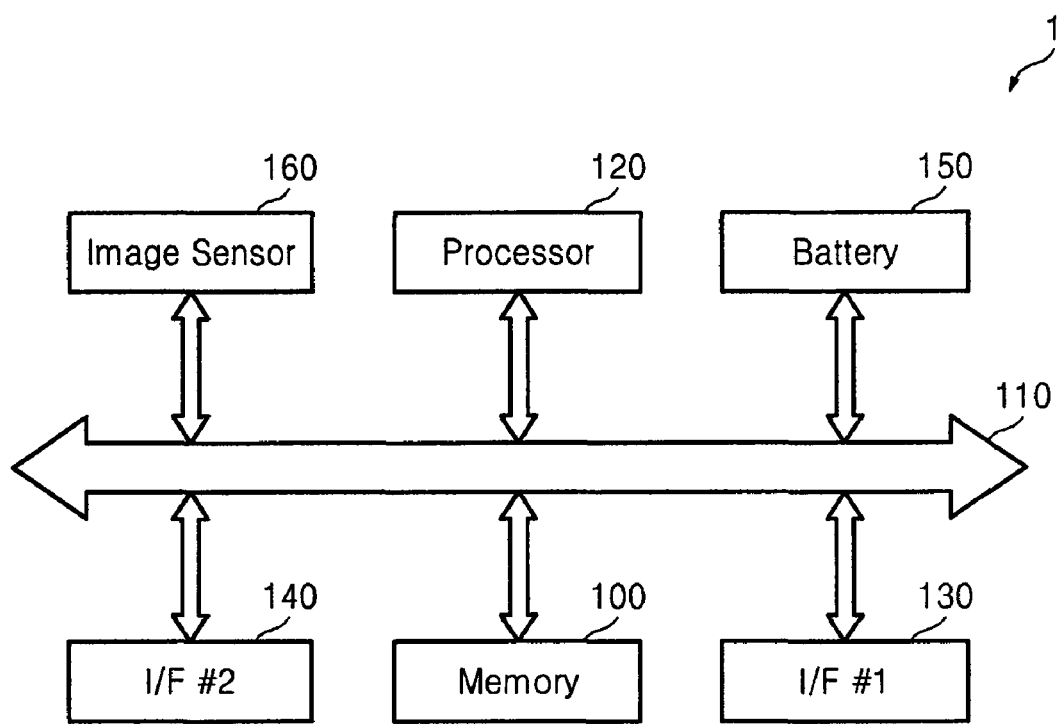
FIG. 5 illustrates a schematic block diagram of a memory system including the semiconductor memory device according to an exemplary embodiment.

FIG. 5 is a schematic block diagram of a memory system 1 including the semiconductor memory device 100 according to an exemplary embodiment. Referring to FIG. 5, the memory system 1 may include the semiconductor memory device 100 and a processor 120.

The processor 120 may generate control signals (not shown) to control a program operation, a write operation, a read operation, or a verification operation of the semiconductor memory device 100. Thus, a control block (not shown) of the semiconductor memory device 100 may perform the program operation, the write operation, the read operation, or the verification operation in response to the control signal output from the processor 120.

The method of applying a bias voltage according to an exemplary embodiment may be implemented in a program command format that may be performed by a variety of computer units and be recorded on a computer readable recording medium.

When the memory system 1 is implemented in a portable application unit, the memory system 1 may further include a battery 150 that supplies operation power to the semiconductor memory device 100 and the processor 120. The portable application unit may include a portable computer, a digital camera, a personal digital assistance (PDA), a cellular telephone, an MP3 player, a portable multimedia player (PMP), an automotive navigation system, a memory card, a system card, a game console, an electronic dictionary, and/or a solid state disk.

The memory system 1 may further include an interface I/F #1 130, for example, an input/output device, configured to exchange data with an external data processing unit. When the memory system 1 of the exemplary embodiment is a wireless system, the memory system 1 may further include a wireless interface I/F #2 140. The wireless interface 140 may be connected to the processor 120, and may wirelessly receive data with an external wireless device via a system bus 110.

The wireless system may be a wireless apparatus such as a PDA, a portable computer, a mobile telephone, a pager, or a digital camera, a RFID reader, and a RFID system. Alternatively, the wireless system may be wireless local area networks (WLANs) or wireless personal area networks (WPANs). Alternatively, the wireless system may be cellular networks.

When the memory system 1 is an image pick-up device, the memory system 1 may further include an image sensor 160 capable of converting an optical signal into an electric signal. The image sensor 160 may be an image sensor using a charge-coupled device (CCD) or a complementary metal-oxide semiconductor (CMOS) image sensor. The memory system 1 may be a digital camera or a cellular telephone having a digital camera function. Alternatively, the memory system 1 may be an artificial satellite system having a camera function.

According to the exemplary embodiment, consumption of a standby current caused by the electric current path to a normal cell may be reduced.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor memory device, comprising:
a memory array including a plurality of bit lines and a plurality of dummy bit lines;
a bias application unit configured to supply bias voltages having a plurality of voltage levels to the plurality of dummy bit lines, the plurality of voltage levels including a ground voltage level, a power voltage level, and a plurality of voltage levels between the ground voltage level and the power voltage level; and
a standby current measuring unit configured to measure a value of at least one of standby currents between at least one of the plurality of bit lines and at least one of the plurality of dummy bit lines, each of the standby currents being generated by each of the bias voltages applied by the bias application unit.

2. The semiconductor memory device as claimed in claim 1, further comprising a control unit configured to control the bias application unit so as to supply a bias voltage having any one of the plurality of voltage levels to each of the plurality of dummy bit lines, based on a measured value of a standby current generated by the bias voltage having any one of the plurality of voltage levels.

3. The semiconductor memory device as claimed in claim 2, wherein the control unit controls the bias application unit so as to supply a first bias voltage among the bias voltages having the plurality of voltage levels to each of the plurality of dummy bit lines, the first bias voltage generating the minimum standby current.

4. The semiconductor memory device as claimed in claim 1, wherein the bias application unit applies a bias voltage to each of the plurality of dummy bit lines in a unit of a chip, banks, or blocks included in the semiconductor memory device.

5. The semiconductor memory device as claimed in claim 1, wherein differences between consecutive voltage levels of the plurality of voltage levels are the same.

6. A semiconductor memory device, comprising:
a mode register set (MRS) in which a plurality of operation modes corresponding to a plurality of voltage levels are set and stored;
a fuse configured to allow a bias voltage to be supplied to each of a plurality dummy bit lines, to the bias voltage having one of the voltage levels set in any one of the plurality of operation modes stored in the MRS; and
a controller configured to measure a value of at least one of standby currents between the plurality of dummy bit lines and a plurality of bit lines, each of the standby currents generated by each of voltage supplied by the fuse, and to control the fuse to allow a voltage generating a minimum standby current to be supplied to each of the plurality of dummy bit lines.

7. The semiconductor memory device as claimed in claim 6, wherein the fuse allows the voltage generating the minimum standby current to be supplied to each of the plurality of dummy bit lines in a unit of a chip, banks, or blocks included in the semiconductor memory device.

8. The semiconductor memory device as claimed in claim 6, wherein the plurality of voltage levels comprise a ground voltage level, a power voltage level, and a plurality of voltage levels between the ground voltage level and the power voltage level.

9. A method of reducing a standby current in a semiconductor memory device that comprises a memory array including a plurality of bit lines and a plurality of dummy bit lines, the method comprising:

supplying bias voltages having a plurality of voltage levels to the plurality of dummy bit lines;

measuring a value of at least one of standby currents between at least one of the plurality of bit lines and at least one of the plurality of dummy bit lines, each of the standby currents being generated by each of the bias voltages; and supplying a bias voltage having any one of the plurality of voltage levels to each of the plurality of dummy bit lines, based on a measured value of a standby current generated by the bias voltage having any one of the plurality of voltage levels.

10. The method as claimed in claim 9, wherein a first bias voltage among the bias voltages having the plurality of voltage levels is supplied to each of the plurality of dummy bit lines, the first bias voltage generating the minimum standby current.

11. The method as claimed in claim 9, wherein a bias voltage is applied to each of the plurality of dummy bit lines in a unit of a chip, banks, or blocks included in the semiconductor memory device.

12. The method as claimed in claim 9, wherein the plurality of voltage levels comprise a ground voltage level, a power voltage level, and a plurality of voltage levels between the ground voltage level and the power voltage level.

13. The method as claimed in claim 12, wherein differences between consecutive voltage levels of the plurality of voltage levels are the same.

14. A method of reducing a standby current in a semiconductor memory device that comprises a memory array including a plurality of bit lines and a plurality of dummy bit lines, the method comprising:

setting and storing a plurality of operation modes corresponding to a plurality of voltage levels in a MRS;

allowing a bias voltage to be supplied to each of a plurality dummy bit lines with a fuse, the bias voltage having one of the voltage levels set in any one of the plurality of operation modes stored in the MRS; and measuring a value of at least one of standby currents between the plurality of dummy bit lines and a plurality of bit lines, each of the standby currents generated by each of voltage supplied by the fuse; and controlling the fuse to allow a voltage generating a minimum standby current to be supplied to each of the plurality of dummy bit lines.

15. The method as claimed in claim 14, wherein a bias voltage is applied to each of the plurality of dummy bit lines in a unit of a chip, banks, or blocks included in the semiconductor memory device.

16. The method as claimed in claim 14, wherein the plurality of voltage levels comprise a ground voltage level, a power voltage level, and a plurality of voltage levels between the ground voltage level and the power voltage level.

* * * * *